(12) United States Patent
Yun et al.

(10) Patent No.: US 8,747,706 B2
(45) Date of Patent: Jun. 10, 2014

(54) CU—IN—ZN—SN-(SE,S)-BASED THIN FILM FOR SOLAR CELL AND PREPARATION METHOD THEREOF

(75) Inventors: Jae-Ho Yun, Daejeon (KR); Kyung-Hoon Yoon, Daejeon (KR); Sejin Ahn, Daejeon (KR); Jihye Gwak, Gyeonggi-do (KR); Kee-Shik Shin, Daejeon (KR); Kyoo-Ho Kim, Daegu (KR); Jin-Hyeok Kim, Gwangju (KR)

(73) Assignee: Korea Institute of Energy Research, Yuseong-gu, Daejeon (KR)

( * ) Notice: Subject to any disclaimer, the term of this patent is extended or adjusted under 35 U.S.C. 154(b) by 137 days.

(21) Appl. No.: 13/379,814

(22) PCT Filed: Nov. 8, 2010

(86) PCT No.: PCT/KR2010/007836
§ 371 (c)(1),
(2), (4) Date: Dec. 21, 2011

(87) PCT Pub. No.: WO2011/074784
PCT Pub. Date: Jun. 23, 2011

(65) Prior Publication Data
US 2012/0103420 A1 May 3, 2012

(30) Foreign Application Priority Data
Dec. 15, 2009 (KR) .......................... 10-2009-0125004

(51) Int. Cl.
*H01B 1/02* (2006.01)

(52) U.S. Cl.
USPC ................................. 252/519.15; 252/519.14

(58) Field of Classification Search
USPC ......................................... 252/519.14, 519.15
See application file for complete search history.

(56) References Cited

U.S. PATENT DOCUMENTS

| | | | |
|---|---|---|---|
| 2012/0138866 A1* | 6/2012 | Agrawal et al. ............ | 252/501.1 |
| 2013/0125988 A1* | 5/2013 | Cao et al. ...................... | 136/264 |

FOREIGN PATENT DOCUMENTS

| | | |
|---|---|---|
| JP | 2007-269589 | 10/2007 |
| KR | 1020020007777 A | 1/2002 |
| KR | 100495925 B1 | 6/2005 |
| KR | 1020070097472 A | 10/2007 |

OTHER PUBLICATIONS

International Search Report dated Jul. 6, 2011 for International Application No. PCT/KR2010/007836, filed Nov. 8, 2010.

* cited by examiner

*Primary Examiner* — Mark Kopec
*Assistant Examiner* — William Young
(74) *Attorney, Agent, or Firm* — Brian R. Morrison; Westerman, Champlin & Koehler, P.A.

(57) ABSTRACT

A Cu—In—Zn—Sn—(Se,S)-based thin film for a solar cell and a preparation method thereof, and more particularly, to a Cu—In—Zn—Sn—(Se,S)-based thin film for a solar cell which can reduce an amount of In to be used and exhibit an excellent conversion efficiency and a preparation method thereof.

2 Claims, No Drawings

CU—IN—ZN—SN-(SE,S)-BASED THIN FILM FOR SOLAR CELL AND PREPARATION METHOD THEREOF

CROSS-REFERENCE TO RELATED APPLICATION

This Application is a Section 371 National Stage Application of International Application No. PCT/KR2010/007836, filed on Nov. 8, 2010, which claims priority to Korean Patent Application No. 10-2009-0125004, filed on Dec. 15, 2009; the contents of which are hereby incorporated by reference in their entireties.

FIELD

The present invention relates to a Cu—In—Zn—Sn—(Se,S)-based thin film for a solar cell and a preparation method thereof, and more particularly, to Cu—In—Zn—Sn—(Se,S)-based thin film for a solar cell with a new composition which can reduce an amount of expensive In to be used and exhibit an excellent conversion efficiency.

BACKGROUND

A need for development of next-generation clean energy has increased with the recent environmental contamination and the exhaustion of fossil fuel. A solar cell is a device that directly converts solar energy into electric energy. Since the solar cell hardly causes the air pollution, has infinite resources, and has a semi-permanent lifetime, the solar cell is expected to be an energy source that can solve the future energy problem.

The CIS or CIGS thin film is one of group I-III-IV compound semiconductors and has the highest conversion efficiency (about 20%) out of thin-film solar cells prepared experimentally. Since the CIS or CIGS thin film can be fabricated with a thickness of 10 or less micrometers and has a stable characteristic even in a long-term use, it can be expected to be a low-cost and high-efficiency solar cell which can be replaced for silicon.

Particularly, the CIS thin film is a direct-transition semiconductor and can be formed with a small thickness, the band gap is 1.04 eV which is relatively suitable for photoelectric conversion, and the light-absorbing coefficient thereof has a relatively large value out of those of known solar cell materials. The CIGS thin film is a material obtained by replacing a part of In with Ga or replacing Se with S to improve the low open voltage of the CIS thin film.

However, since the CIS or CIGS thin film employs In or Ga element which is expensive, it has problems in that the preparation cost thereof is relatively high and the band gap thereof is relatively low.

To improve the efficiency of a solar cell and to reduce the cost thereof, there is a need for a new material that can enhance the band gap and contains a low-cost element and a preparation method thereof.

Recently, to develop a new material in which In element can be replaced with a low-cost element, a CZTS-based thin film in which In is replaced with Zn or Sn has been vigorously studied. However, the CZTS-based thin film has a problem that its efficiency is lower than that of the CIS or CIGS thin film.

The inventors have studied about a compound semiconductor thin film that can be used as a light-absorbing layer of a solar cell and that has a high conversion efficiency and a reduced preparation cost and developed a Cu—In—Zn—Sn—(Se,S)-based thin film for a solar cell that can reduce the amount of In to be used and can exhibit a conversion efficiency similar to that of the known CIS or CIGS thin film and a preparation method thereof, thereby completing the invention.

Technical Problem

A technical goal of the invention is to provide a Cu—In—Zn—Sn—(Se,S)-based thin film for a solar cell, which is a compound semiconductor thin film capable of being used as a light-absorbing layer of a solar cell, can reduce the amount of In to reduce the preparation cost, and exhibits a conversion efficiency similar to that of the CIS or CIGS thin film, and a preparation method thereof.

Solution to Problem

To accomplish the technical goal, the invention provides a Cu—In—Zn—Sn—(Se,S)-based thin film for a solar cell that is used as a light-absorbing layer of the solar cell.

(Zn+Sn)/(In+Zn+Sn) in the Cu—In—Zn—Sn—(Se,S)-based thin film may be greater than 0 and equal to or smaller than 0.5. When (Zn+Sn)/(In+Zn+Sn) is greater than 0 and equal to or smaller than 0.5, the conversion efficiency of the solar cell is high.

In addition, the invention provides a preparation method of a Cu—In—Zn—Sn—(Se,S)-based thin film for a solar cell, including: a step (step 1) of forming a CZTS-based thin film on a substrate; and a step (step 2) of depositing In and Se on the CZTS-based thin film formed in step 1. The CZTS-based thin film is a group IB-II-IV-VIA quaternary (4-component) compound thin film or quinary (5-component) compound thin film in which all group IIIA elements in a CIS-based compound which is a group IB-IIIA-VIA compound semiconductor are substituted with Zn+Sn which are group II-IV elements, and examples thereof include a Cu—Zn—Sn—Se thin film, a Cu—Zn—Sn—S thin film, and a Cu—Zn—Sn—Se—S thin film.

The invention also provides a preparation method of a Cu—In—Zn—Sn—(Se,S)-based thin film for a solar cell, including: a step (step A) of forming a CIS-based thin film on a substrate; and a step (step B) of depositing Zn, Sn, and Se on the CIS-based thin film.

Advantageous Effects of Invention

According to the invention, there is provided a Cu—In—Zn—Sn—(Se,S)-based thin film for a solar cell, which can exhibit a conversion efficiency more excellent than that of the CZTS-based thin film, which can reduce an amount of In to reduce its preparation cost, and which exhibits a conversion efficiency similar to that of the known CIS or CIGS thin film, and a preparation method thereof.

MODE FOR THE INVENTION

Hereinafter, the invention will be described in detail.
The invention provides a Cu—In—Zn—Sn—(Se,S)-based thin film for a solar cell used as a light-absorbing layer in a solar cell.

According to an embodiment of the invention, the Cu—In—Zn—Sn—(Se,S)-based thin film for a solar cell is a quinary compound thin film or a senary compound thin film in which a part of group IIIA elements of a CIS-based (for example, Cu—In—S-based, Cu—In—Se-based, Cu—In—(S,Se)-based, Cu—In—Ga—Se-based, and Cu—In—Ga—

(Se,S)-based) compound is substituted with Zn+Sn. The Cu—In—Zn—Sn—(Se,S)-based thin film for a solar cell may be one of quinary compounds and senary compounds expressed by a chemical formula, $CuIn_{1-a-b-c}Ga_aZn_b$-$Sn_cSe_{2-y}S_y$ (where a, b, c, and y are substitution ratios of atoms and are real numbers satisfying $0 \leq a<1$, $0<b<1$, $0<c<1$, $0<a+b+c<1$, and $0 \leq y \leq 2$). More specifically, the Cu—In—Zn—Sn—(Se,S)-based thin film for a solar cell is one of quinary compounds and senary compounds in which some elements of group IIIA elements such as In, Ga, and Al in a CIS-based compound as a group IB-IIIA-VIA compound semiconductor, for example, a ternary compound comprising $CuInSe_2$, $CuInS_2$, $CuGaSe_2$, or $CuGaS_2$, a quaternary compound comprising $CuIn_{1-x}Ga_xSe_2$ (where x represents a substitution ratio of an atom and is a real number satisfying $0<x<1$), or a quinary or senary compound comprising $CuIn_{1-x}Ga_xSe_{2-y}S_y$ (where x and y represent a substitution ratio of an atom and are a real number satisfying $0<x<1$ and $0<y<2$), $CuIn_aAl_bGa_cSe_2$ (where a, b, and c are substitution ratios of atoms and are real numbers satisfying $0<a<1$, $0<b<1$, $0<c<1$, and $a+b+c=1$), or $CuIn_aAl_bGa_cSe_{2-y}S_y$ (where a, b, c, and y are substitution ratios of atoms and are real numbers satisfying $0 \leq a<1$, $0<b<1$, $0<c<1$, $a+b+c=1$, and $0<y<2$), are substituted with Zn+Sn. The Cu—In—Zn—Sn—(Se,S)-based thin film is preferably one of a Cu—In—Zn—Sn—S thin film, a Cu—In—Zn—Sn—Se thin film, and a Cu—In—Zn—Sn—S—Se thin film.

(Zn+Sn)/(In+Zn+Sn) in the Cu—In—Zn—Sn—(Se,S)-based thin film is preferably greater than 0 and equal to or smaller than 0.5. When (Zn+Sn)/(In+Zn+Sn) is greater than 0 and equal to or smaller than 0.5, the conversion efficiency of the solar cell is high.

The Cu—In—Zn—Sn—(Se,S)-based thin film for a solar cell can solve the high preparation cost and the low conversion efficiency which are the problems of the past compound semiconductor thin film, and can be used as a light-absorbing layer of a solar cell.

The invention provides a solar cell employing the Cu—In—Zn—Sn—(Se,S)-based thin film for a solar cell as a light-absorbing layer. The invention also provides a preparation method of the Cu—In—Zn—Sn—(Se,S)-based thin film for a solar cell.

Hereinafter, the preparation method of the Cu—In—Zn—Sn—(Se,S)-based thin film for a solar cell will be described in detail.

According to an embodiment of the invention, the preparation method of a Cu—In—Zn—Sn—(Se,S)-based thin film for a solar cell includes a step (step 1) of forming a CZTS-based thin film on a substrate and a step (step 2) of depositing In and Se on the CZTS-based thin film formed in step 1.

First, a CZTS-based thin film is formed on a substrate (step 1). Known substrates which can be used for a thin-film solar cell, such as a glass substrate such as a soda-lime glass substrate, a ceramic substrate such as an alumina substrate, a metal substrate such as a stainless steel substrate and a Cu tape, and a polymer substrate can be used as the substrate, but the invention is not limited to the substrates. A soda-lime glass substrate in which molybdenum is deposited as a back contact can be preferably used.

According to an embodiment of the invention, Cu, ZnS, and Sn can be deposited on the soda-lime glass substrate in which molybdenum is formed as a back contact by the use of a deposition method such as a co-sputtering method or an RF sputtering method to form a CZTS-based thin film.

Then, In and Se are deposited on the CZTS-based thin film formed on the substrate.

The step of depositing In and Se on the CZTS-based thin film can be performed using a variety of deposition methods such as a vacuum co-evaporation method, an MOCVD (Metal-Organic Chemical Vapor Deposition) method, and an electrodeposition method, and is preferably performed using the vacuum co-evaporation method. The vacuum co-evaporation method, the MOCVD (Metal-Organic Chemical Vapor Deposition) method, and the electrodeposition method used to deposit In and Se on the CZTS-based thin film are known to those skilled in the art and thus details thereof are not described.

In the course of depositing In and Se on the CZTS-based thin film in step 2, step 2 is preferably performed in a state where the substrate temperature is maintained in the range of 400° C. to 600° C. to promote the reaction In and Se with a precursor material of the CZTS-based thin film. When the substrate temperature is in the range of 400° C. to 500° C., the composition loss of Sn in the CZTS-based thin film can be minimized, but the size of crystal grains is small. On the contrary, when the substrate temperature is in the range of 500° C. to 600° C., the size of crystal grains is large but the loss of Sn is caused. Accordingly, the composition ratio of Sn in the initial CZTS-based thin film should be greater than the composition ratio of Sn in the final Cu—In—Zn—Sn—(Se,S)-based thin film. The supply time of In and Se affects the final composition of In and is preferably 30 minutes or less in consideration of the loss of Sn or the like.

In the preparation method of the Cu—In—Zn—Sn—(Se,S)-based thin film for a solar cell, (Zn+Sn)/(In+Zn+Sn) in the Cu—In—Zn—Sn—(Se,S)-based thin film in step 2 is preferably greater than 0 and equal to or smaller than 0.5. The amounts of In and Se to be deposited can be adjusted by changing the effusion cell temperatures.

According to another embodiment of the invention, the preparation method of a Cu—In—Zn—Sn—(Se,S)-based thin film for a solar cell includes a step (step A) of forming a CIS-based thin film on a substrate and a step (step B) of depositing Zn, Sn, and Se on the CIS-based thin film.

First, a CIS-based thin film is formed on a substrate (step A). Then Zn, Sn, and Se are deposited on the CIS-based thin film (step B). The step of depositing Zn, Sn, and Se on the CIS-based thin film can be performed using the vacuum co-evaporation method, the MOCVD method, the electrodeposition method, or the like and is preferably performed using the vacuum co-evaporation method.

According to an embodiment of the invention, Zn, Sn, and Se can be deposited on the CIS-based thin film using the vacuum co-evaporation method to form a Cu—In—Zn—Sn—Se thin film. At this time, to prevent Sn from being re-evaporated in the form of Sn—Se binary compound, it is preferable that step B is performed in a state where the substrate temperature is maintained in the range of 300° C. to 400° C. The supply time of Zn, Sn, and Se in step B affects the final composition of In and is preferably 30 minutes or less in consideration of the loss of Sn or the like.

In the preparation method of the Cu—In—Zn—Sn—(Se,S)-based thin film for a solar cell, (Zn+Sn)/(In+Zn+Sn) in the Cu—In—Zn—Sn—(Se,S)-based thin film in step B is preferably greater than 0 and equal to or smaller than 0.5. The amounts of Zn, Sn, and Se to be deposited can be adjusted by changing the effusion cell temperatures.

Hereinafter, preferable examples of the invention will be described, but the examples are provided to exemplify the invention. It will be apparent to those skilled in the art that the invention can be modified and changed in various forms without departing from the technical spirit and scope of the invention, and the modifications and changes belong to the scope of the appended claims.

EXAMPLES

Example 1

Preparation of Cu—In—Zn—Sn—S—Se Thin Film for Solar Cell

A molybdenum back contact with a thickness of about 1 μm was deposited on a soda-lime glass substrate using a DC sputtering method. Cu, ZnS, and Sn were deposited on the substrate using a co-sputtering method to form a CZTS (Cu—Zn—Sn—S) thin film. To prevent the delamination and the composition changes of the CZTS thin film during post heat treatment, a copper capping film was deposited on the CZTS thin film using a sputtering method. The thickness and composition of the CZTS thin film were adjusted by varying the sputtering power and the time. The CZTS thin film were formed so that the thickness of the CZTS thin film should be 1 μm and the atomic ratio of Cu:Zn:Sn:S in the CZTS thin film should be about 40:22:20:18. In and Se were deposited on the copper capping film using a vacuum co-evaporation method to form a Cu—In—Zn—Sn—S—Se thin film for a solar cell. At this time, the substrate temperature was maintained at 520° C. to promote the reaction of In and Se with the precursor material of the CZTS thin film, the amounts of In and Se were adjusted by varying the effusion cell temperatures, and In and Se were deposited for 15 minutes, whereby the Cu—In—Zn—Sn—S—Se thin film for a solar cell was prepared. In the Cu—In—Zn—Sn—S—Se-based thin film for a solar cell prepared in this way, (Zn+Sn)/(In+Zn+Sn) was 0.06. This means that Zn+Sn is replaced for 6% of the total sites of In in the Cu—In—Zn—Sn—S—Se thin film and that the amount of In is reduced by 6%.

Example 2

Preparation of Cu—In—Zn—Sn—Se Thin Film for Solar Cell

A molybdenum back contact with a thickness of about 1 μm was deposited on a soda-lime glass substrate using a DC sputtering method. Then, a CISe ($CuInSe_2$) thin film was deposited thereon using a three-step vacuum co-evaporation method. Zn, Sn, and Se were deposited on the CISe thin film using a vacuum co-evaporation method to form a Cu—In—Zn—Sn—Se thin film. To prevent the re-evaporation of the Sn in the form of a Sn—Se binary compound at this time, the substrate temperature was maintained at 400° C. or less, the amounts of Zn and Sn were adjusted by varying the effusion cell temperatures, and the deposition time of Zn, Sn, and Se was changed to 5 minutes and 10 minutes, whereby two Cu—In—Zn—Sn—Se thin films for solar cells were prepared. (Zn+Sn)/(In+Zn+Sn) in the Cu—In—Zn—Sn—Se-based thin film for a solar cell prepared by depositing Zn, Sn, and Se for 5 minutes was 0.16 and (Zn+Sn)/(In+Zn+Sn) in the Cu—In—Zn—Sn—Se thin film for a solar cell prepared by depositing Zn, Sn, and Se for 10 minutes was 0.17. This means that Zn+Sn is replaced for 16% and 17% of the total sites of In in the Cu—In—Zn—Sn—Se-based thin films and that the amount of In is reduced by 16% and 17%.

The invention claimed is:

1. A thin film for use as a light-absorbing layer in a solar cell, the thin film comprising a Cu—In—Zn—Sn—(Se,S)-based composition, wherein the Cu—In—Zn—Sn—(Se,S)-based composition is one of quinary compounds and senary compounds expressed by a chemical formula, $CuIn_{1-a-b-c}Ga_aZn_bSn_cSe_{2-y}S_y$, and wherein a, b, c, and y are substitution ratios of atoms and are real numbers satisfying $0 \leq a < 1$, $0 < b < 1$, $0 < c < 1$, $0 < a+b+c < 1$, and $0 \leq y \leq 2$.

2. The thin film for a solar cell according to claim 1, wherein (Zn+Sn)/(In+Zn+Sn) in the Cu—In—Zn—Sn—(Se,S)-based thin film is greater than 0 and equal to or smaller than 0.5.

* * * * *